(12) United States Patent
Kamble et al.

(10) Patent No.: US 10,218,268 B1
(45) Date of Patent: Feb. 26, 2019

(54) VOLTAGE REFERENCE CIRCUIT AND METHOD OF PROVIDING A VOLTAGE REFERENCE

(71) Applicant: Analog Devices Global Unlimited Company, Hamilton (BM)

(72) Inventors: Maitrey Kamble, Mumbai (IN); Michael C. W. Coln, Lexington, MA (US); Vinayak Mukund Kulkarni, Bangalore (IN)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/936,122

(22) Filed: Mar. 26, 2018

(51) Int. Cl.
*H03M 1/12* (2006.01)
*H02M 3/07* (2006.01)
*H03M 1/46* (2006.01)

(52) U.S. Cl.
CPC .............. *H02M 3/07* (2013.01); *H03M 1/466* (2013.01)

(58) Field of Classification Search
CPC ................................ H02M 3/07; H03M 1/466
USPC .................................................. 341/150, 161
See application file for complete search history.

(56) References Cited

U.S. PATENT DOCUMENTS

| | | |
|---|---|---|
| 5,854,574 A | 12/1998 | Singer et al. |
| 8,390,502 B2 | 3/2013 | Kapusta |
| 8,436,677 B2 | 5/2013 | Kull et al. |
| 8,456,343 B2 * | 6/2013 | Nakamura .......... H03M 1/0845 324/548 |
| 8,610,616 B2 | 12/2013 | Baghini et al. |
| 8,629,797 B2 * | 1/2014 | Gotoh ..................... H03M 1/06 341/155 |
| 8,907,836 B2 * | 12/2014 | Ono .................... H03M 1/0607 341/122 |
| 9,223,332 B1 * | 12/2015 | Himmelbauer ........... G05F 3/02 |
| 9,590,650 B1 | 3/2017 | Kull et al. |
| 9,800,258 B2 | 10/2017 | Martens et al. |
| 9,935,648 B1 | 4/2018 | Kamble et al. |

(Continued)

OTHER PUBLICATIONS

Elumalai, Iniyavan, "A Capacitance-Based Reference Scheme for a 14b-Linear, 100 MS/s SAR-Assisted Pipeline ADC", Elumalai, 2012, Master of Science Thesis, Delft University of Technology Department of Electrical Engineering, (Sep. 21, 2012), 102.

(Continued)

*Primary Examiner* — Brian K Young
(74) *Attorney, Agent, or Firm* — Schwegman Lundberg & Woessner, P.A.

(57) ABSTRACT

The present disclosure relates to a voltage reference circuit and a method of providing a voltage reference. The voltage reference circuit uses a switched capacitor arrangement to move charge between capacitors during different phases of operation of the circuit to which the voltage reference is being provided. The circuit being provided with a voltage reference may be an analog-to-digital converter (ADC). A reservoir capacitor is used to supply the reference voltage. During a phase in which no voltage reference is required, charge is shared between the capacitors of the switched capacitor arrangement, in order to boost the charge on the reservoir capacitor. After charge sharing, the reservoir capacitor is topped up with an output from a reference buffer. The reservoir capacitor may then be used again in the next conversion phase.

26 Claims, 20 Drawing Sheets

(56) References Cited

U.S. PATENT DOCUMENTS

2016/0182078 A1   6/2016   Shen et al.
2018/0131384 A1   5/2018   Kalathil et al.

OTHER PUBLICATIONS

Lee, Jeong-Sup, et al., "Capacitor Array Structure and Switch Control for Energy-Efficient SAR Analog-to-Digital Converters", Circuits and Systems, 2008. ISCAS 2008. IEEE International Symposium on. IEEE, 2008, (2013), 4.

* cited by examiner

VOLTAGE REFERENCE CIRCUIT AND METHOD OF PROVIDING A VOLTAGE REFERENCE

FIELD OF THE DISCLOSURE

The present disclosure relates to a voltage reference circuit and a method for providing a voltage reference. The disclosure also relates to an analog-to-digital converter (ADC) including a voltage reference circuit.

BACKGROUND

Analog-to-Digital Converters (ADCs) typically convert an analog input voltage into a digital output code. In order to do this, most ADCs compare the input voltage to a reference voltage using a device such as a comparator. A 1-bit ADC uses a single comparator and compares the input voltage to the reference voltage. The ADC outputs a "1" if the input is higher than the reference voltage, and a "0" if the input voltage is lower than the reference voltage. Multi-bit ADCs are more complex, and generate multi-bit output codes. One such multi-bit ADC is a successive approximation register (SAR) ADC. A SAR ADC operates by generating a digital approximation of the analog input voltage. It does this bit-by-bit, starting with the highest bit (the most significant bit, or MSB) and moving down to the lowest bit (the least significant bit, or LSB). To do this, it uses a digital-to-analog converter (DAC) which generates an analog voltage to compare with the input voltage using a comparator. It is common for SAR ADCs to use capacitive DACs, however, other types of DAC are used in some SAR ADCs. The DAC requires a reference voltage in order to generate a suitable analog voltage for comparison with the input voltage.

The voltage reference is typically supplied by a voltage reference circuit. In the case of SAR ADCs, the voltage reference circuit provides charge to the ADC using one or more capacitors. For example, a typical voltage reference circuit for a SAR ADC includes a reference buffer connected to a decoupling capacitor. The reference buffer may or may not be provided on the same chip as the ADC. However, the decoupling capacitor is required to be large (in the order of 10 uF), and is therefore provided off-chip. The decoupling capacitor is required to be large because it needs to provide enough charge for a complete conversion, which includes multiple bit trials. The capacitor needs to be large enough such that the accuracy of later bit trials are not degraded as the charge of the decoupling capacitor is reduced. However, a large off-chip capacitor is expensive and utilises valuable area on the printed circuit board (PCB). Furthermore, a large decoupling capacitor means that the output impedance of the circuit is required to be low, which in turn makes design of the reference buffer challenging.

In addition to the above, a key requirement of the voltage reference circuit is that reference value does not drop too much as the ADC draws charge during a conversion phase. The reference buffer needs to charge the off-chip capacitor back to the reference charge before the next conversion phase starts. The greater the drop in charge, the more work the reference buffer has to do.

SUMMARY OF THE DISCLOSURE

The present disclosure relates to a voltage reference circuit and a method of providing a voltage reference. The voltage reference circuit uses a switched capacitor arrangement to move charge between capacitors during different phases of operation of the circuit to which the voltage reference is being provided. The circuit being provided with a voltage reference may be an analog-to-digital converter (ADC). A reservoir capacitor is used to supply the reference voltage. During a phase in which no voltage reference is required, charge is shared between the capacitors of the switched capacitor arrangement, in order to boost the charge on the reservoir capacitor. After charge sharing, the reservoir capacitor is topped up with an output from a reference buffer. The reservoir capacitor may then be used again in the next conversion phase.

In a first aspect, the present disclosure provides a voltage reference circuit, comprising: a source of current, and a switched capacitor arrangement coupled to an output of the source of current, the switched capacitor arrangement comprising a battery capacitor and a reservoir capacitor, the reservoir capacitor configured to provide a reference voltage at an output of the circuit, wherein the switched capacitor arrangement configured to: output the reference voltage using the reservoir capacitor during a first phase of operation; redistribute charge between the battery capacitor and the reservoir capacitor during a second phase of operation in order to increase the charge on the reservoir capacitor; and continue charging the reservoir capacitor using the source of current during a third phase of operation.

In a second aspect, the present disclosure provides a method of providing a reference voltage, comprising: outputting a reference voltage, using a reservoir capacitor of a switched capacitor arrangement, during a first phase of operation; redistributing charge between a battery capacitor of the switched capacitor arrangement and the reservoir capacitor during a second phase of operation in order to increase the charge on the reservoir capacitor; and continuing to charge the reservoir capacitor using a source of current during a third phase of operation.

In a third aspect, the present disclosure provides a successive approximation register (SAR) analog-to-digital converter (ADC) circuit, comprising: a capacitive digital-to-analog converter (DAC); and a voltage reference circuit for providing a voltage reference to the DAC during a conversion phase of the DAC, the voltage reference circuit comprising: a source of current; a reservoir capacitor; and a battery capacitor; wherein the voltage reference circuit is configured to: couple the reservoir capacitor to the DAC during a conversion phase; decouple the reservoir capacitor from the DAC and redistribute charge between the at least one battery capacitor and the reservoir capacitor during a first part of an acquisition phase of the DAC, and charge the reservoir capacitor using the source of current during a second part of the acquisition phase.

In a further embodiment, a circuit according to any preceding aspect, wherein the switched capacitor arrangement further comprises: a first switch, connected between the battery capacitor and the output of the reference buffer; and wherein the switched capacitor arrangement is further configured to: close the first switch at the beginning of the first phase of operation; and keep the first switch open during the third phase of operation.

In a further embodiment, a circuit according to any preceding aspect, wherein the switched capacitor arrangement further comprises: a second switch, connected between the reservoir capacitor and the reference buffer; and wherein the switch capacitor arrangement is further configured to:
  open the second switch at the beginning of the first phase of operation; keep the second switch closed during the third phase of operation.

In a further embodiment, a circuit according to any preceding aspect, wherein the switched capacitor arrangement further comprises: a third switch, connected between the reservoir capacitor and the battery capacitor; and wherein the switch capacitor arrangement is further configured to: open the third switch at the beginning of the first phase of operation; close the third switch at the beginning of the second phase of operation; and open the third switch at the beginning of the third phase of operation.

Further aspects and features of the disclosure may be found in the appended claims.

BRIEF DESCRIPTION OF THE DRAWINGS

The present disclosure will now be described, by way of example only, and with reference to the accompanying drawings, in which.

DETAILED DESCRIPTION

The present disclosure provides a voltage reference circuit which includes a switched capacitor arrangement. The circuit charges different capacitors during different phases of operation, and utilising charge-sharing to boost the charge on the reservoir capacitor. This arrangement removes the requirement for a large, off-chip capacitor, and reduces the load on the reference buffer, making buffer design more straight-forward.

The circuit is particularly suitable for providing an ADC with a reference voltage. As such, the voltage reference circuit is operated with reference to the conversion and acquisition phases of the ADC. The voltage reference circuit includes an output, or reservoir capacitor, which provides the reference voltage to the ADC. At the beginning of the conversation phase, the reservoir capacitor is fully or sufficiently charged. The reservoir capacitor provides the required reference voltage, and the charge on the reservoir capacitor is gradually depleted during the conversion phase. During this same time, another capacitor of the switched capacitor arrangement is gradually charged by a source of current, such as a reference buffer. This capacitor may be referred to as a battery capacitor. At the end of the conversion phase, the battery capacitor is fully or sufficiently charged.

As soon as the conversion phase is over, the ADC begins the acquisition phase. At the beginning of the acquisition phase, the reservoir capacitor is disconnected from the ADC, and connected to the battery capacitor. Charge sharing then occurs between the capacitors, such that the charge on the reservoir capacitor is boosted by the battery capacitor. Charge sharing occurs for a short duration at the beginning of the acquisition phase. The duration of this phase should be long enough for charge sharing to be complete, or for sufficient charge to transfer to the reservoir capacitor.

After charging sharing is complete, the reservoir capacitor is disconnected from the battery capacitor and the remaining charge for the reservoir capacitor is provided by the reference buffer. As the amount of charge required is typically much less than half of the value of the reservoir capacitor, the reference buffer can top up the reservoir capacitor during the rest of the acquisition phase.

The charge-sharing arrangement effectively provides slew-assist to the amplifier of the reference buffer, by charging the reservoir capacitor at a rate not possible using the reference buffer alone. Owing to ADC redundancy, the value of the reservoir capacitor can be small enough that it can be provided on-chip. Furthermore, the design of the reference buffer is more straight-forward, owing to the reduced charging requirements.

Figure 1:
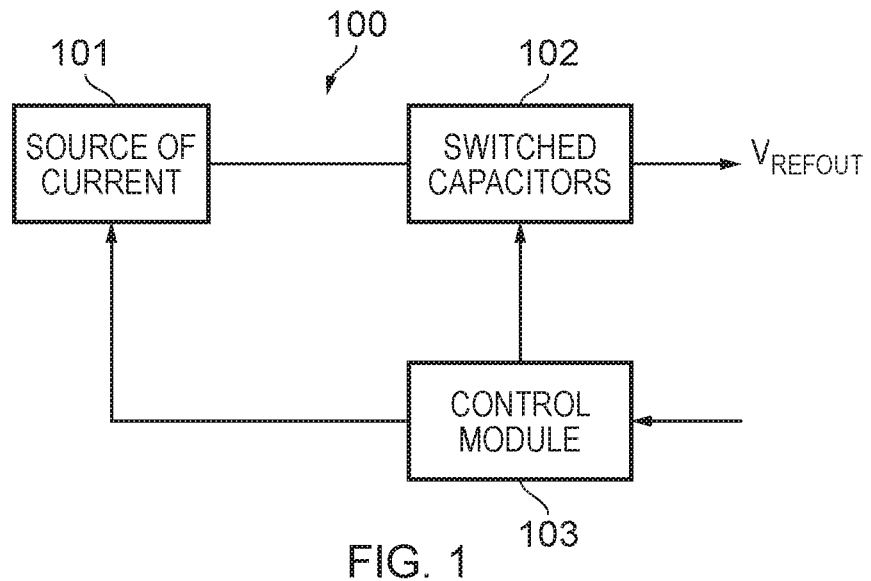
FIG. 1 is a schematic diagram of a circuit in accordance with an embodiment of the disclosure.

FIG. 1 is a schematic diagram of a voltage reference circuit 100 in accordance with an embodiment of the disclosure. The voltage reference circuit 100 includes a source of current 101. The source of current 101 is connected to a switched-capacitor arrangement 102. The switched capacitor arrangement 102 includes two or more capacitors, connected together by a plurality of switches. The switched capacitor arrangement 102 is configured to share charge amongst the capacitors by controlling the switches. The source of current 101 is configured to charge one or more of the capacitors of the switched capacitors, depending on the arrangement of the switches.

The source of current 101 may be a reference buffer, as will be described in more detail below. Suitable reference buffers include operational amplifiers, and specifically operational transconductance amplifiers (OTAs).

The switched capacitor arrangement 102 provides a voltage reference $V_{REFOUT}$ at an output of the circuit 100. The output of the circuit 100 is coupled to a further circuit or device requiring a voltage reference. In one example, this further circuit may be an analog-to-digital converter (ADC) such as a successive approximation register (SAR) ADC. The switched capacitor arrangement 102 is configured to arrange the switches in order to provide an appropriate voltage at $V_{REFOUT}$.

The operation of the circuit 100 is dependent upon the circuit to which the voltage reference is being provided. As such, the circuit 100 includes a control module 103. The control module 103 receives control information from the ADC. The control information may include the current phase of operation of the ADC, for example whether the ADC is in a conversion or acquisition phase. Furthermore, the control information may include details of the ADC's previous input, as will be described in more detail below. The control module 103 is connected to, and configured to control, the switched capacitor arrangement 102 and optionally to the source of current 101.

Figure 2:
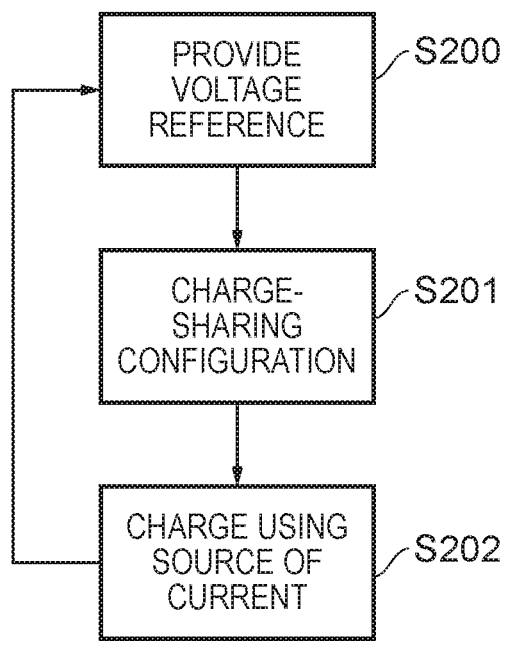
FIG. 2 is a flow chart showing a method of operation of the circuit of FIG. 1.

The method of operation of the circuit shown in FIG. 1 will now be described with reference to FIG. 2. The control module 103 is configured to control the circuit 100 depending on the phase of operation of the circuit to which the voltage reference is being provided. For example, as noted above, these phases may relate to conversion and acquisition phases of the ADC. The control module 103 may control the source of current 101 and the switch capacitor arrangement 102 so that in a first phase (S200), the switched capacitor arrangement 102 provides a voltage reference at the circuit output. This may be the conversion phase of an ADC. In a second phase (S201), the control module may control the switch capacitor arrangement such that it enters a charge-sharing configuration, to share charge amongst the capacitors of the switched capacitor arrangement 102. This may be a first part of an acquisition phase of the ADC. In a third phase of operation (S202), the control module 103 may control the source of current 101 and the switched capacitor arrangement 102 such that the source of current charges at least one capacitor of the switched capacitor arrangement. This may be a second part of the acquisition phase of the ADC. Finally, the circuit may return to the first phase of operation.

In the following embodiments, the control module is omitted for clarity. However, it may be assumed that the switches are controlled by an appropriate control module or logic.

Figure 3:
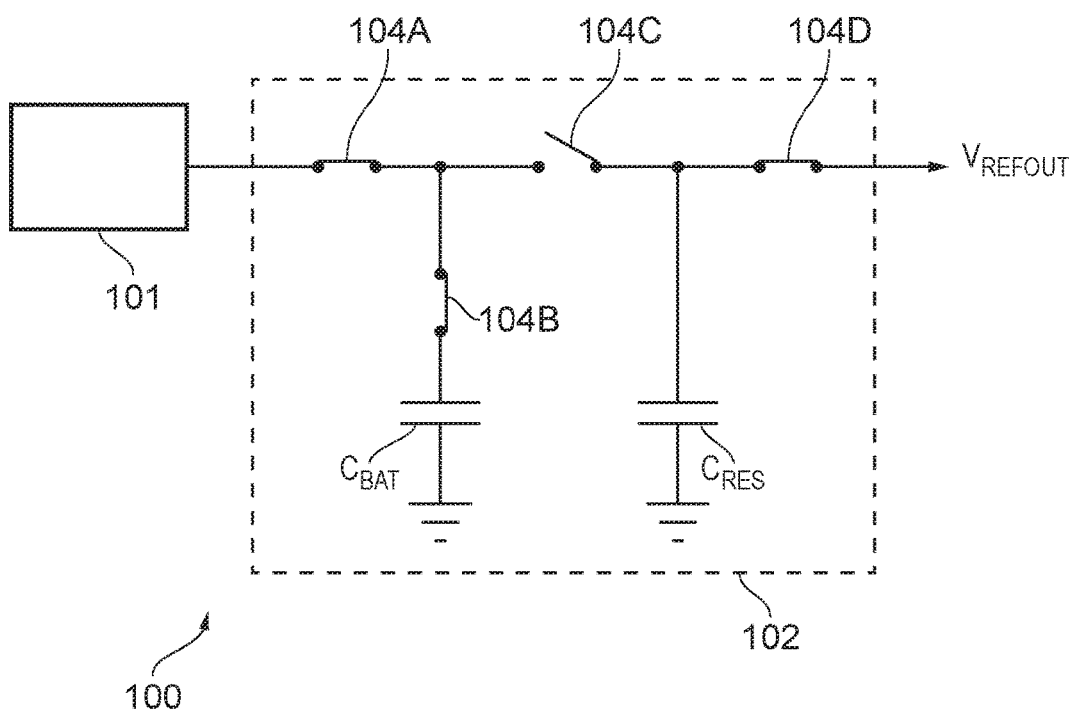
FIG. 3 is a schematic diagram of a circuit in a first configuration, in accordance with a further embodiment of the disclosure.

FIG. 3 is a circuit diagram of the voltage reference circuit 100 showing further details not shown in FIG. 1. The control module is omitted for clarity. However, it may be assumed that the switches are controlled by an appropriate control module or logic. The voltage reference circuit 100 includes the source of current 101. The source of current may be a reference buffer, however other types of source of current may be used. The output of the source of current 101 is provided to the rest of the voltage reference circuit 100, as will be described in more detail below.

The voltage reference circuit 100 includes the switched capacitor arrangement 102. The switched capacitor arrangement 102 is coupled to an output of the source of current 101. The source of current 101 is configured to provide current to the switched capacitor arrangement 102, in order to charge one or more capacitors which form part of the switched capacitor arrangement 102. In this example, the switched capacitor arrangement 102 includes a battery capacitor $C_{BAT}$. The purpose of the battery capacitor $C_{BAT}$ is to store charge during the conversion phase of an analog-to-digital converter to which the voltage reference circuit 100 is connected.

The switched capacitor arrangement 102 also includes a reservoir capacitor $C_{RES}$. The reservoir capacitor $C_{RES}$ is for providing a reference voltage to a circuit to which the voltage reference circuit 100 is connected. In this example, the circuit is an analog-to-digital converter (ADC), such as a SAR ADC. The switched capacitor arrangement 102 also includes a plurality of switches 104A to 104D. An output of the source of current 101 is connected to a first switch 104A. The battery capacitor $C_{BAT}$ is connected between ground and a second switch 104B. The first switch 104A is also connected to the second switch 104B. The reservoir capacitor $C_{RES}$ is connected between ground and a third switch 104C. Switch 104C is also connected to the first switch 104A and the second switch 104B. A fourth switch 104D is also connected to the reservoir capacitor $C_{RES}$ and to an output $V_{REFOUT}$ of the circuit 100.

The combination of switches 104A to 104D enables various combinations of the capacitors of the switched capacitor arrangement 102 to be connected to the output of the source of current 101, to other capacitors in the arrangement, and to the output of the circuit $V_{REFOUT}$.

Figure 4:
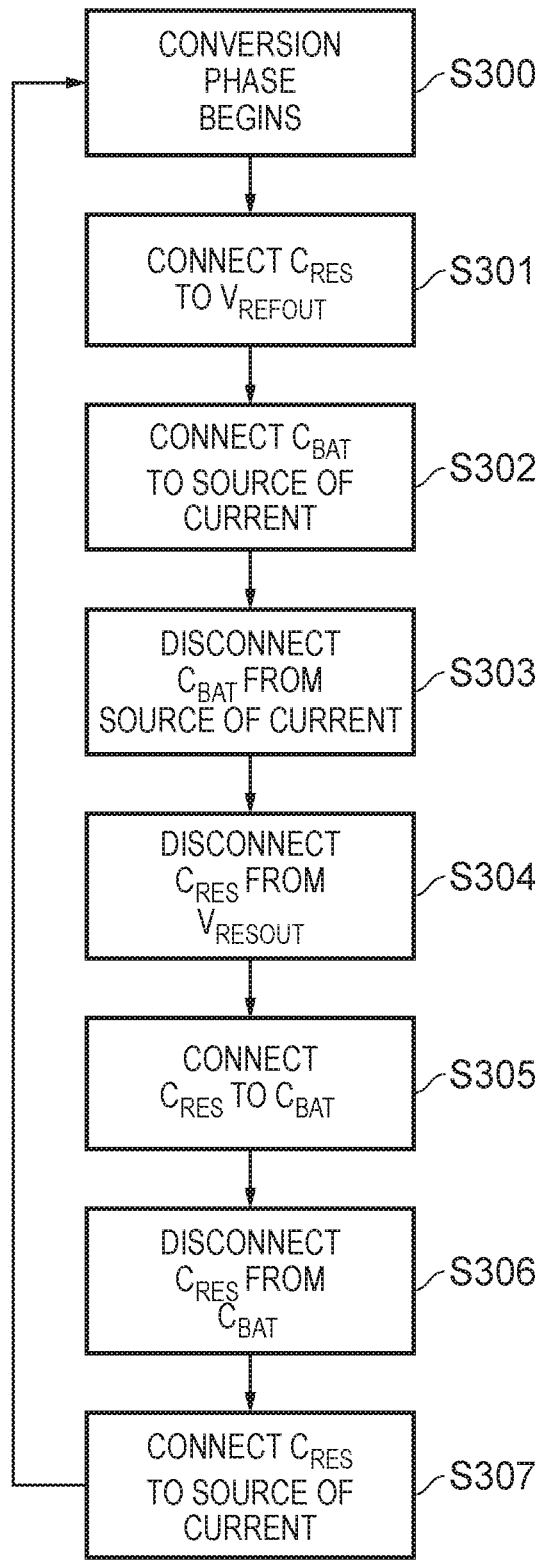
FIG. 4 is a flow chart showing a method of operation of the circuit of FIG. 3.

The operation of the circuit shown in FIG. 3 will now be described with reference to the phases of operation of a SAR analog-to-digital converter (ADC). FIG. 4 is a flow chart showing the method of operation of the voltage reference circuit 100 shown in FIG. 3. The operation begins when the ADC is operating in a conversion phase (S300). During the conversion phase, the voltage reference circuit 100 is required to provide the ADC with a voltage reference. As such, during the conversion phase the reservoir capacitor $C_{RES}$ must provide a reference voltage to the output $V_{REFOUT}$. Accordingly, during the conversion phase $C_{RES}$ is disconnected from the source of current 101 and the remainder of the switched capacitor arrangement 102 by opening switch 104C. Additionally, switch 104D is closed in order to connect the reservoir capacitor $C_{RES}$ to $V_{REFOUT}$ and the ADC (S301). This is shown in the circuit diagram shown in FIG. 3. During this phase of operation, the charge on the reservoir capacitor $C_{RES}$ is gradually depleted. The amount of charge depleted by the ADC converter will depend upon which bit is currently being considered by the SAR ADC. As such, the degree to which $C_{RES}$ is depleted is input-dependent. During the conversion phase, the source of current 101 is used to charge the battery capacitor $C_{BAT}$ (S302). As such, switches 104A and 104B are closed. The conversion phase may be regarded as the first phase of operation of the voltage reference circuit 100.

Figure 5:
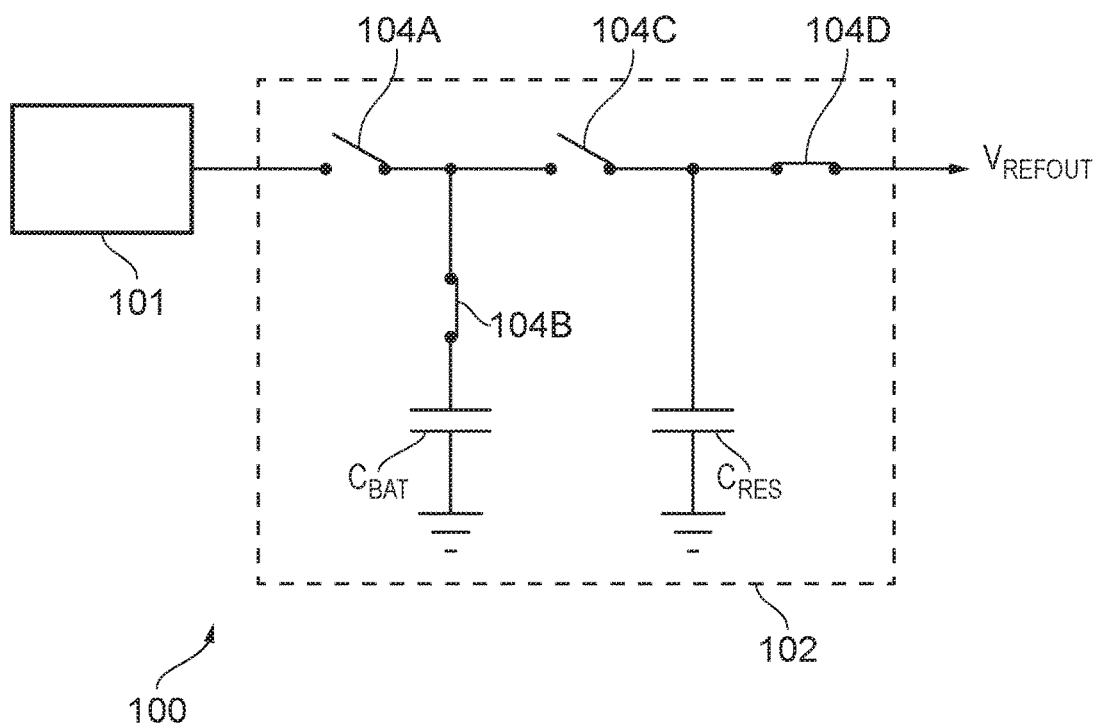
FIG. 5 is a schematic diagram of the circuit of FIG. 3 in a second configuration.

FIG. 5 shows the configuration of the voltage reference circuit 100 at the end of the conversion phase. At this point, $C_{RES}$ remains disconnected from $C_{BAT}$ and from the source of current 101. However, $C_{BAT}$ is also disconnected from the source of current 101 by opening switch 104A (S303). At this stage of operation, the charge on $C_{RES}$ has been depleted to a degree during the conversion phase of the ADC. The capacitor battery $C_{BAT}$ is sufficiently or fully charged in preparation for boosting the charge on the reservoir capacitor $C_{RES}$.

The next phase of operation is when the ADC enters its acquisition phase. The first part of the acquisition phase may be regarded as a second phase of operation of the voltage reference circuit 100. During the acquisition phase, the voltage reference circuit 100 is no longer required to supply a voltage reference to the ADC. As such, the circuit replenishes the charge on $C_{RES}$ during this period.

Figure 6:
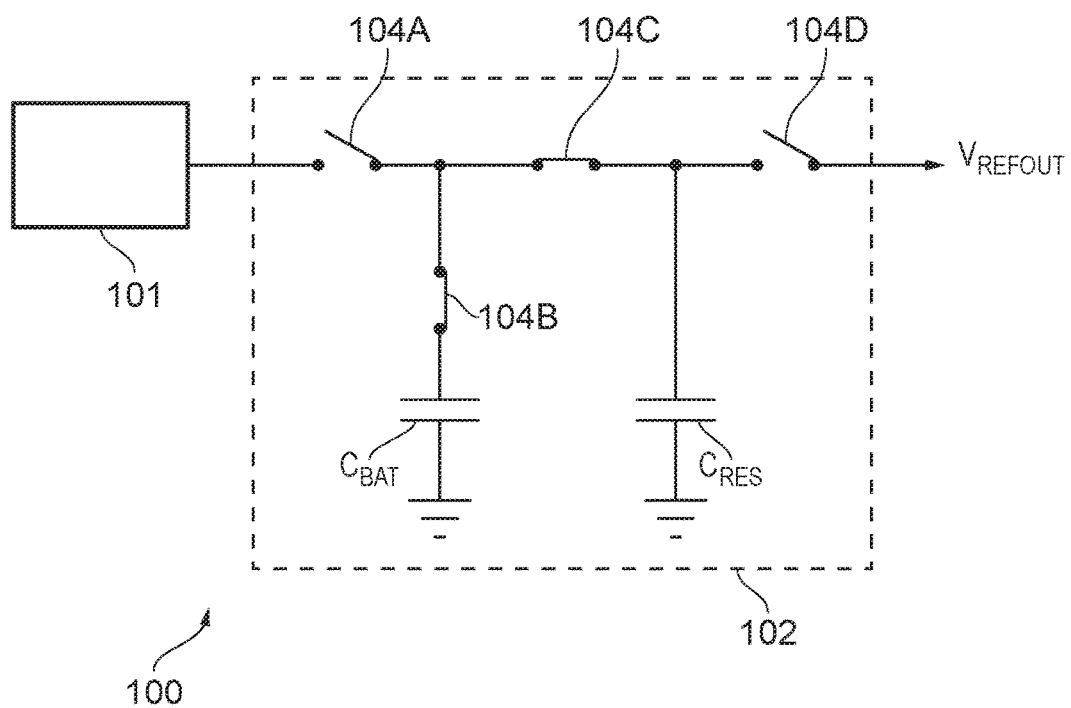
FIG. 6 is a schematic diagram of the circuit of FIG. 3 in a third configuration.

FIG. 6 shows the configuration of the voltage reference circuit 100 at the beginning of the ADC's acquisition phase. During this phase, the battery capacitor $C_{BAT}$ is connected to the reservoir capacitor $C_{RES}$ in order to boost the charge on the reservoir capacitor $C_{RES}$. The purpose of this is to reduce the load on the source of current 101 during the remainder of the acquisition phase. As such, during this phase of operation the output $V_{REFOUT}$ is disconnected from the ADC by opening switch 104D (S304). Switch 104A remains open, and switch 104C is closed in order to connect the reservoir capacitor $C_{RES}$ to the battery capacitor $C_{BAT}$ (S305). $C_{BAT}$ and $C_{RES}$ therefore enter a charge sharing arrangement. As the charge on $C_{BAT}$ is much greater than the charge on $C_{RES}$, charge flows onto capacitor $C_{RES}$. At the end of the first part of the acquisition phase, the voltage on $C_{RES}$ is much closer to the required $V_{REFOUT}$, meaning that the source of current 101 does not have much work to do to top up the charge on $C_{RES}$.

Figure 7:
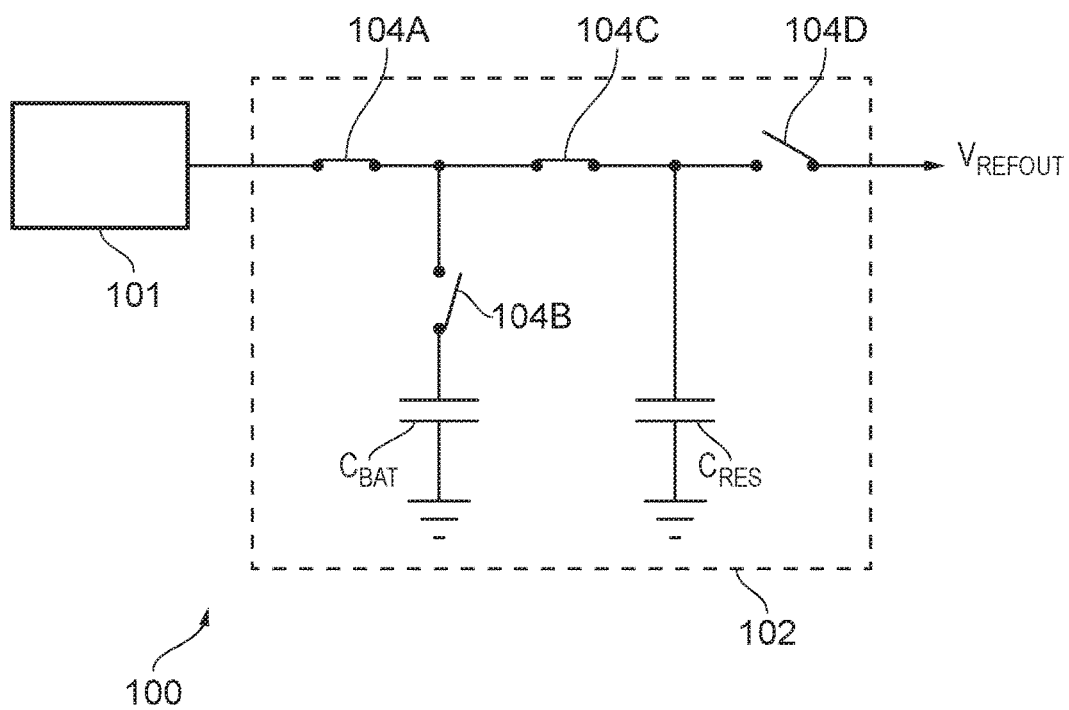
FIG. 7 is a schematic diagram of the circuit of FIG. 3 in a fourth configuration.

Once charge-sharing between $C_{BAT}$ and $C_{RES}$ is complete, the circuit enters a third phase of operation which is the second part of the acquisition phase of the ADC. This is shown in FIG. 7. In this stage of the operation, $C_{RES}$ is disconnected from $C_{BAT}$ by opening switch 104B (S306). Switch 104A is closed to connect $C_{RES}$ directly to the output of the source of current 101 (S307). The source of current 101 now has to replenish very little charge on $C_{RES}$. The process then returns to the conversion phase and the arrangement shown in FIG. 3.

The switched capacitor arrangement 102 provides a boost to the reservoir capacitor $C_{RES}$ at the beginning of the acquisition phase. This reduces the burden on the source of current 101, and enables $C_{RES}$ to be charged more quickly that might be possible with the source of current 101 alone.

Figure 8:
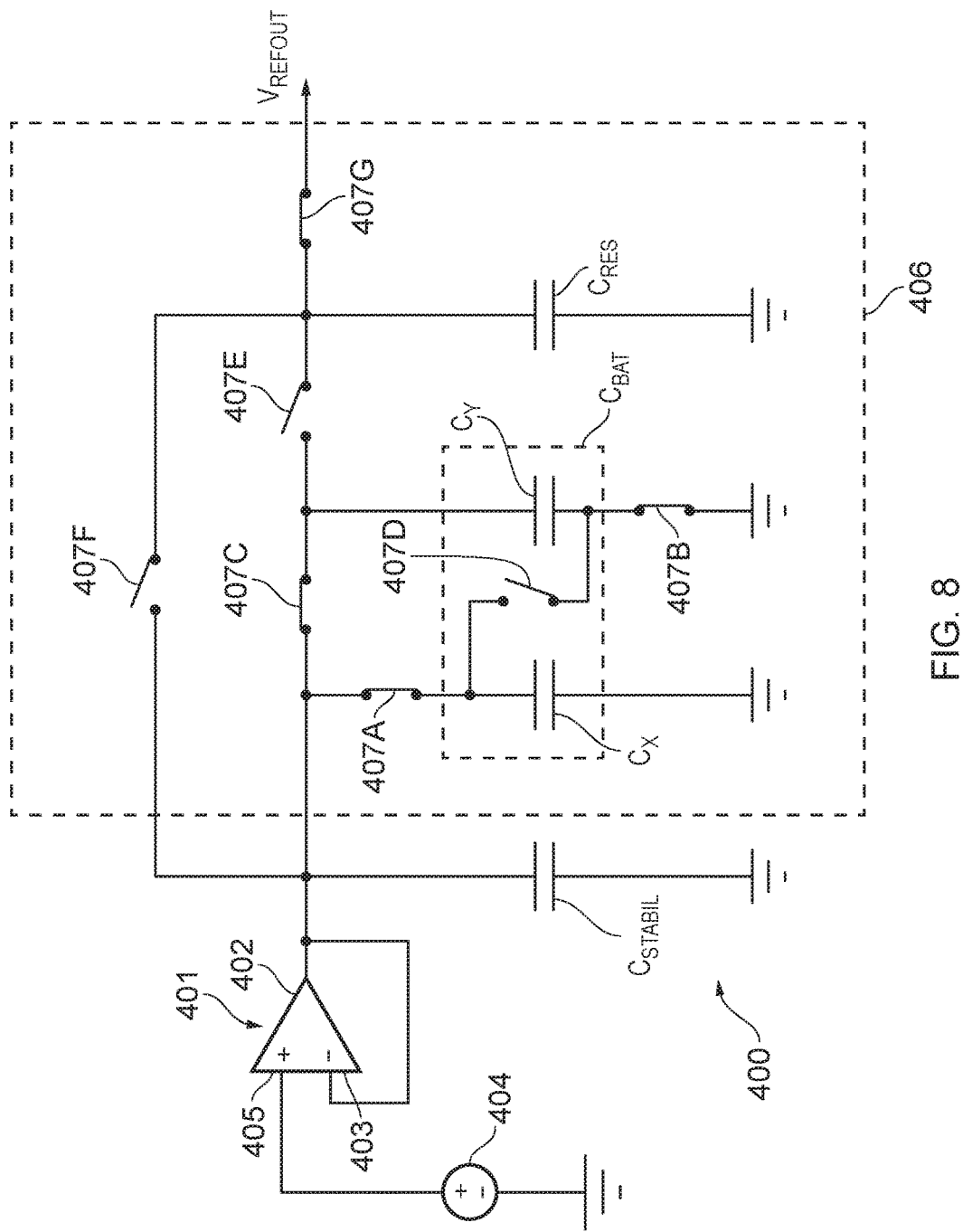
FIG. 8 is a schematic diagram of a circuit in a first configuration, in accordance with a further embodiment of the disclosure.

FIG. 8 is a circuit diagram of a voltage reference circuit 400 in accordance with an embodiment of this disclosure. The voltage reference circuit 400 includes a reference buffer 401. The reference buffer 401 includes an amplifier 402 which may be a transistor-level single-stage operational transconductance amplifier (OTA). The output of the amplifier 402 is coupled to the inverting input 403 of the amplifier in order to provide negative feedback. A band gap voltage source 404 is connected between ground and the non-inverting input 405 of the amplifier 402. As such, the amplifier 402 acts as a unity gain buffer. The output of the amplifier 402 acts as a source of current which is provided to the rest of the voltage reference circuit 400 in order to provide a reference voltage, as will be described in more detail below. As an alternative to a band gap voltage source, other types of voltage source may be utilised. The circuit 400 also includes a stabilisation capacitor $C_{STABIL}$ which is provided to stabilise the amplifier 402 when the other capacitors are disconnected from the amplifier. $C_{STABIL}$ is connected between ground and an output of the amplifier 402.

The voltage reference circuit 400 includes a switched capacitor arrangement 406. The switched capacitor arrangement 406 is coupled to an output of the reference buffer 401. The reference buffer 401 is configured to provide current to the switched capacitor arrangement 406, in order to charge one or more capacitors which form part of the switched capacitor arrangement 406.

The switched capacitor arrangement 406 includes a battery capacitor $C_{BAT}$. The battery capacitor $C_{BAT}$ may be composed of a plurality of sub-capacitors. In the present example, the battery capacitor $C_{BAT}$ includes sub-capacitors $C_X$ and $C_Y$. The battery capacitor is composed of two sub-capacitors in a configuration that enables the value of $C_{BAT}$ to be changed. This will be described in further detail below. The purpose of the battery capacitor $C_{BAT}$ is to store charge during the conversion phase of an analog-to-digital converter to which the voltage reference circuit 400 is connected.

The switched capacitor arrangement 406 also includes a reservoir capacitor $C_{RES}$. The reservoir capacitor $C_{RES}$ is for providing a reference voltage to a circuit to which the voltage reference circuit 400 is connected. In this example, the circuit is an analog-to-digital converter (ADC), such as a SAR ADC. The switched capacitor arrangement 406 also includes a plurality of switches 407A to 407G. Sub-capacitor $C_X$ is connected between ground and a first switch 407A. The first switch 407A is also connected to an output of the reference buffer 401. The sub-capacitor $C_Y$ is connected to a second switch 407B. Second switch 407B is also connected to ground. Sub-capacitor $C_Y$ is also connected to a third switch 407C. Third switch 407C is also connected to an output of the reference buffer 401 and to the first switch 407A. A fourth switch 407D is connected between the sub-capacitors $C_X$ and $C_Y$. A fifth switch 407E is also connected between $C_{RES}$ and the sub-capacitor $C_Y$. Additionally, sixth switch 407F is connected between an output of the reference buffer 401 and the reservoir capacitor $C_{RES}$. The reservoir capacitor $C_{RES}$ is connected between ground and the output reference voltage $V_{REFOUT}$ via a seventh switch 407G.

The combination of switches 407A to 407G enables various combinations of the capacitors of the switched capacitor arrangement 406 to be connected to the output of the reference buffer 401, to other capacitors in the arrangement, and to the output of the circuit $V_{REFOUT}$. In particular, the switches associated with the battery capacitor $C_{BAT}$ enable the sub-capacitors $C_X$ and $C_Y$ to be connected together in series or in parallel, thereby enabling different voltages to be supplied to the reservoir capacitor $C_{RES}$.

Figure 9:
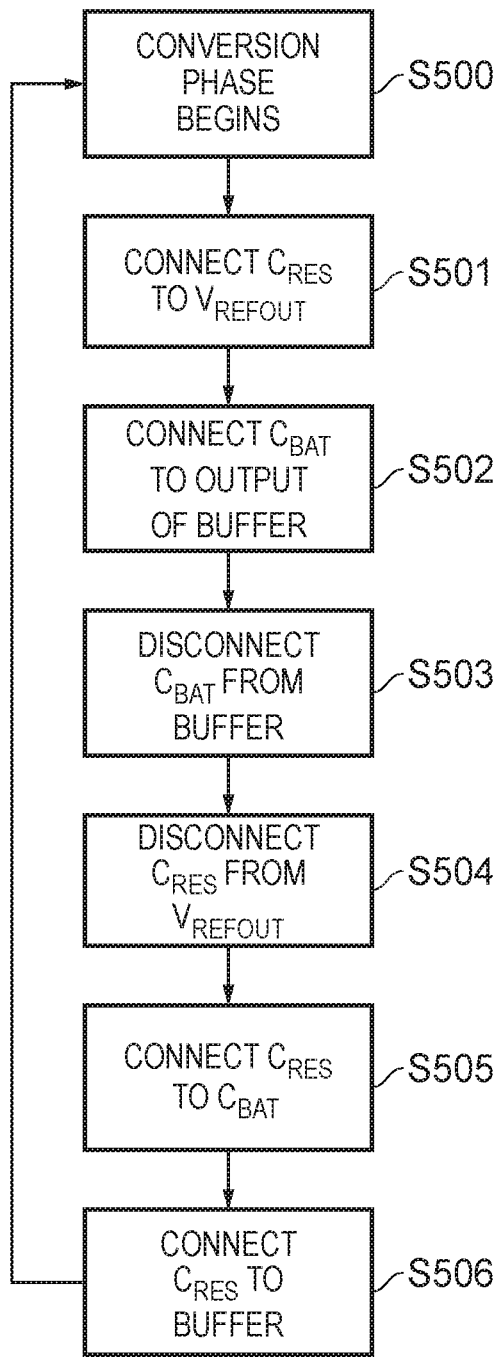
FIG. 9 is a flow chart showing a method of operation of the circuit of FIG. 8.

The operation of the circuit shown in FIG. 8 will now be described with reference to the phases of operation of a SAR analog-to-digital converter (ADC). FIG. 9 is a flow chart showing the method of operation of the voltage reference circuit 400 shown in FIG. 8. The operation begins when the ADC is operating in a conversion phase (S500). During the conversion phase, the voltage reference circuit is required to provide the ADC with a voltage reference. As such, during the conversion phase the reservoir capacitor $C_{RES}$ must provide a reference voltage to the output $V_{REFOUT}$. Accordingly, during the conversion phase $C_{RES}$ is disconnected from the reference buffer 401 and the remainder of the switched capacitor arrangement 406 by opening switches 407E and 407F (S501). Furthermore, switch 407G is closed in order to connect the reservoir capacitor $C_{RES}$. This is shown in the circuit diagram shown in FIG. 8. During this phase of operation, the charge on the reservoir capacitor $C_{RES}$ is gradually depleted. The amount of charge depleted by the ADC will depend upon which bit is currently being considered by the SAR ADC. As such, the degree to which $C_{RES}$ is depleted is input-dependent.

During the conversion phase, the reference buffer 401 is used to charge the battery capacitor $C_{BAT}$ (S502). As such, switches 407A, 407B and 407C are closed, and switch 407D is open. During the conversion phase the reference buffer 401 charges the sub-capacitors $C_X$ and $C_Y$. The conversion phase may be regarded as the first phase of operation of the voltage reference circuit 400.

Figure 10:
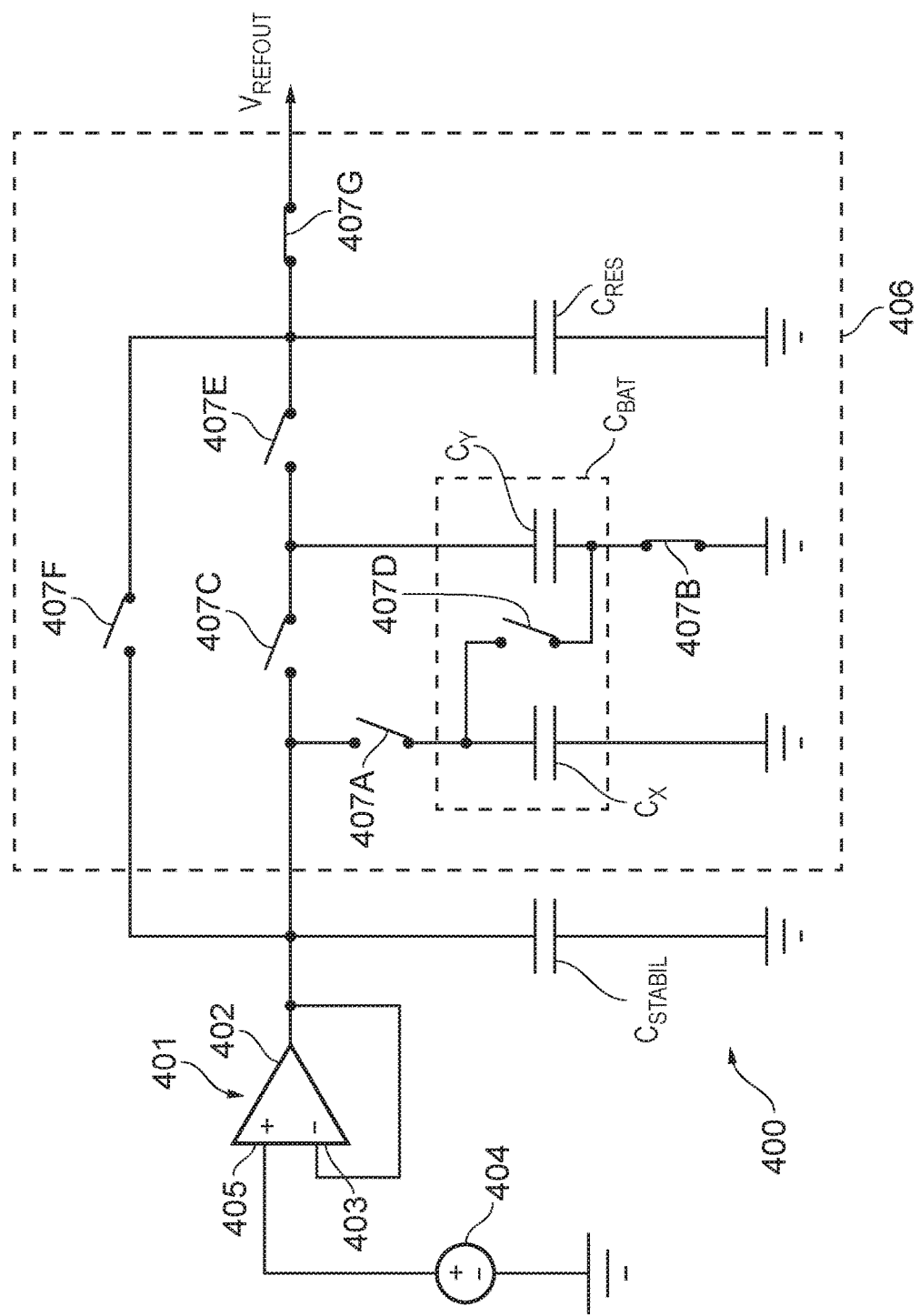
FIG. 10 is a schematic diagram of the circuit of FIG. 8 in a second configuration.

FIG. 10 shows the configuration of the voltage reference circuit 400 at the end of the conversion phase. At this point, $C_{RES}$ remains disconnected from $C_{BAT}$ and from the reference buffer 400. However, $C_{BAT}$ is also disconnected from the reference buffer 401 by opening switches 407A and 407C (S503). At this stage of operation, the charge on $C_{RES}$ has been depleted to a degree during the conversion phase of the ADC. The sub-capacitors $C_X$ and $C_Y$ of the capacitor battery $C_{BAT}$ are sufficiently or fully charged in preparation for boosting the charge on the reservoir capacitor $C_{RES}$.

The next phase of operation is when the ADC enters its acquisition phase. The first part of the acquisition phase may be regarded as a second phase of operation of the voltage reference circuit 400. During the acquisition phase, the voltage reference circuit is no longer required to supply a voltage reference to the ADC. As such, the circuit replenishes the charge on $C_{RES}$ during this period.

Figure 11:
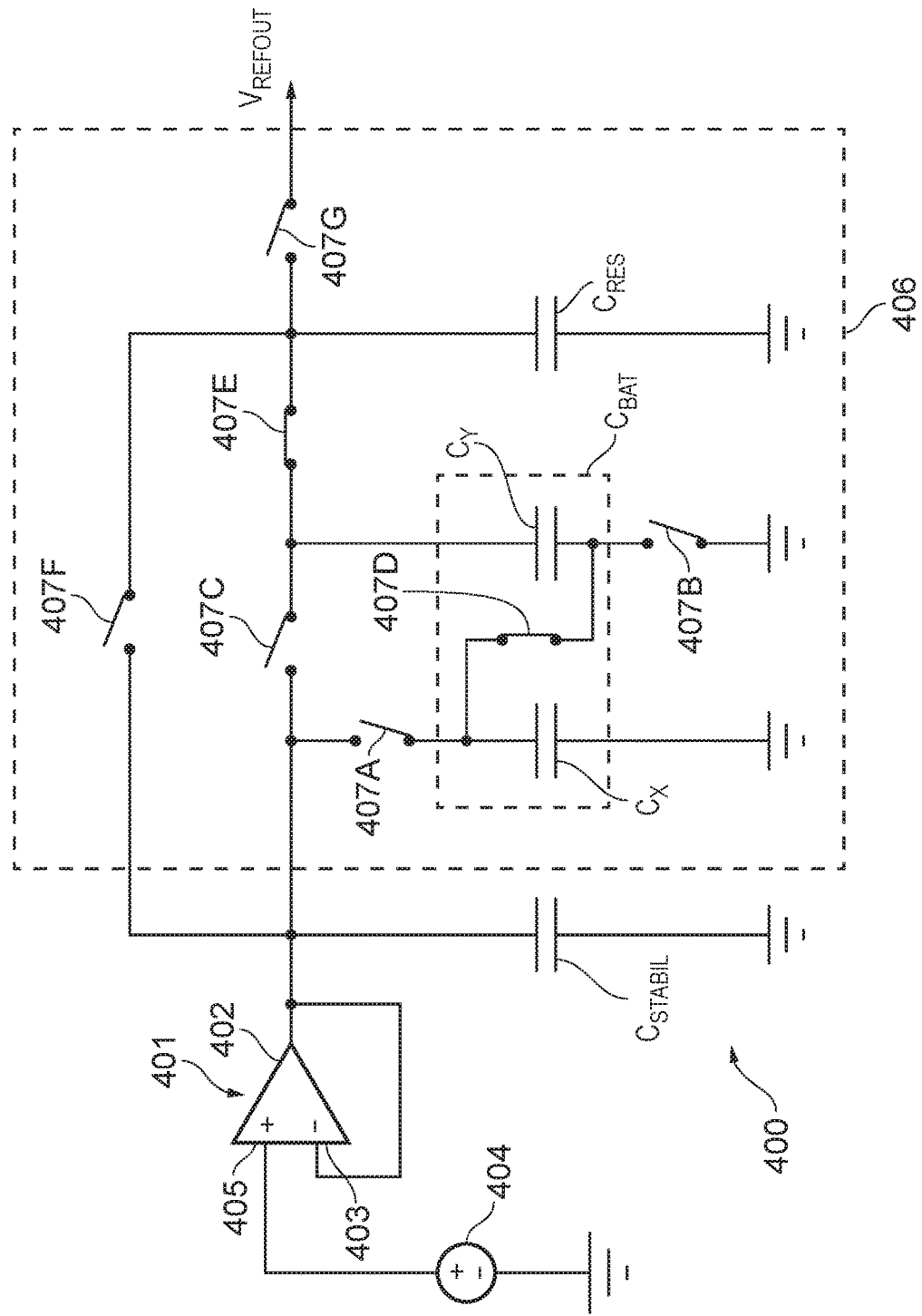
FIG. 11 is a schematic diagram of the circuit of FIG. 8 in a third configuration.

FIG. 11 shows the configuration of the voltage reference circuit 400 at the beginning of the ADC's acquisition phase. During this phase, the battery capacitor $C_{BAT}$ is connected to the reservoir capacitor $C_{RES}$ in order to boost the charge on the reservoir capacitor $C_{RES}$. The purpose of this is to reduce the load on the reference buffer 401 during the remainder of the acquisition phase. As such, during this phase of operation the output $V_{REFOUT}$ is disconnected from the ADC by opening switch 407G (S504). Switch 407F remains open, and switch 407E is closed in order to connect the reservoir capacitor $C_{RES}$ to the battery capacitor $C_{BAT}$ (S505). The sub-capacitors $C_X$ and $C_Y$ of the battery capacitor $C_{BAT}$ are, in this example, arranged in series. To achieve this, switch 407A is opened, switch 407B is opened, switch 407D is closed, and switch 407C is opened. $C_{BAT}$ and $C_{RES}$ therefore enter a charge sharing arrangement. As the charge on $C_{BAT}$ is much greater than the charge on $C_{RES}$, charge flows onto capacitor $C_{RES}$. At the end of the first part of the acquisition phase, the voltage on $C_{RES}$ is much closer to the required $V_{REFOUT}$, meaning that the reference buffer 401 does not have much work to do to top up the charge on $C_{RES}$. In addition to dismantling $C_{BAT}$ in to sub-capacitors $C_X$ and $C_Y$, sub-capacitors $C_X$ and $C_Y$ may be controlled digitally to vary their individual values. As such, the value of $C_{BAT}$ may be digitally controlled. This means that the values of $C_X$ and $C_Y$ can be a function of the ADC's output from the previous conversion. As such, the charge supplied by $C_{BAT}$ can be a function of the previous input of the ADC. As noted above, as the amount of charge lost in $C_{RES}$ due to the ADC's conversion is a function of the input of the ADC, this reduces the input-dependence of the current demand from the reference buffer 401.

Figure 12:
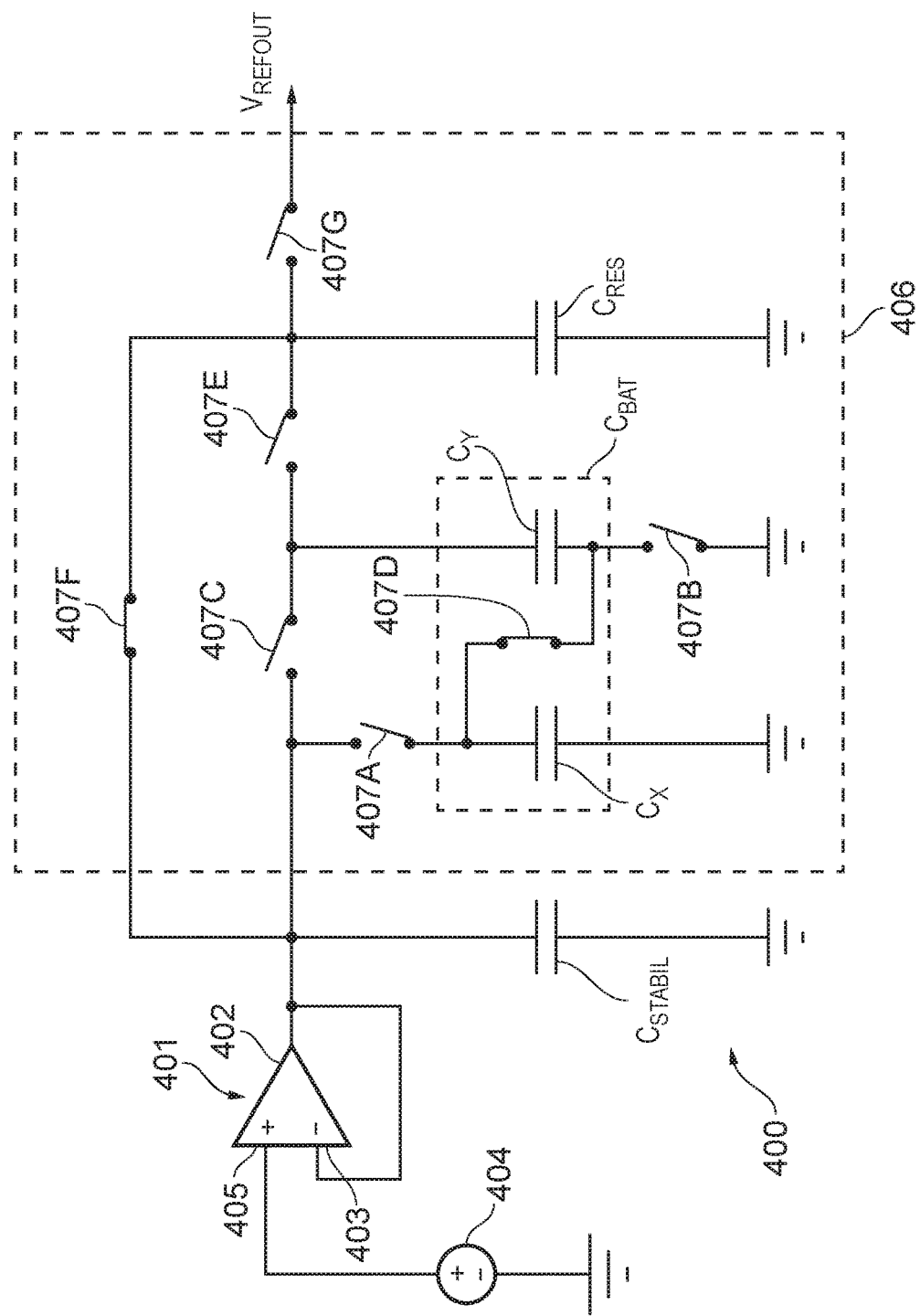
FIG. 12 is a schematic diagram of the circuit of FIG. 8 in a fourth configuration.

Once charge-sharing between $C_{BAT}$ and $C_{RES}$ is complete, the circuit enters a third phase of operation which is the second part of the acquisition phase of the ADC. This is shown in FIG. 12. Switch 407F is closed to connect $C_{RES}$ directly to the output of the reference buffer 401 (S506). The reference buffer 401 now has to replenish very little charge on $C_{RES}$, as the input-dependent reference current has been supplied by $C_{BAT}$. The process then returns to the conversion phase and the arrangement shown in FIG. 8.

The switched capacitor arrangement 406 provides slew assist to the amplifier 402 of the reference buffer 401. The rate at which the reservoir capacitor $C_{RES}$ is recharged is much greater than the slew rate of the amplifier 402 of the buffer 401.

In the above example, the reservoir capacitor $C_{RES}$ has a value of 80 pF and the acquisition time was 30 ns. The reference voltage provided by the band gap reference 404 is 2.2v. The switches have a resistance of 10Ω to 100Ω.

Figure 13:
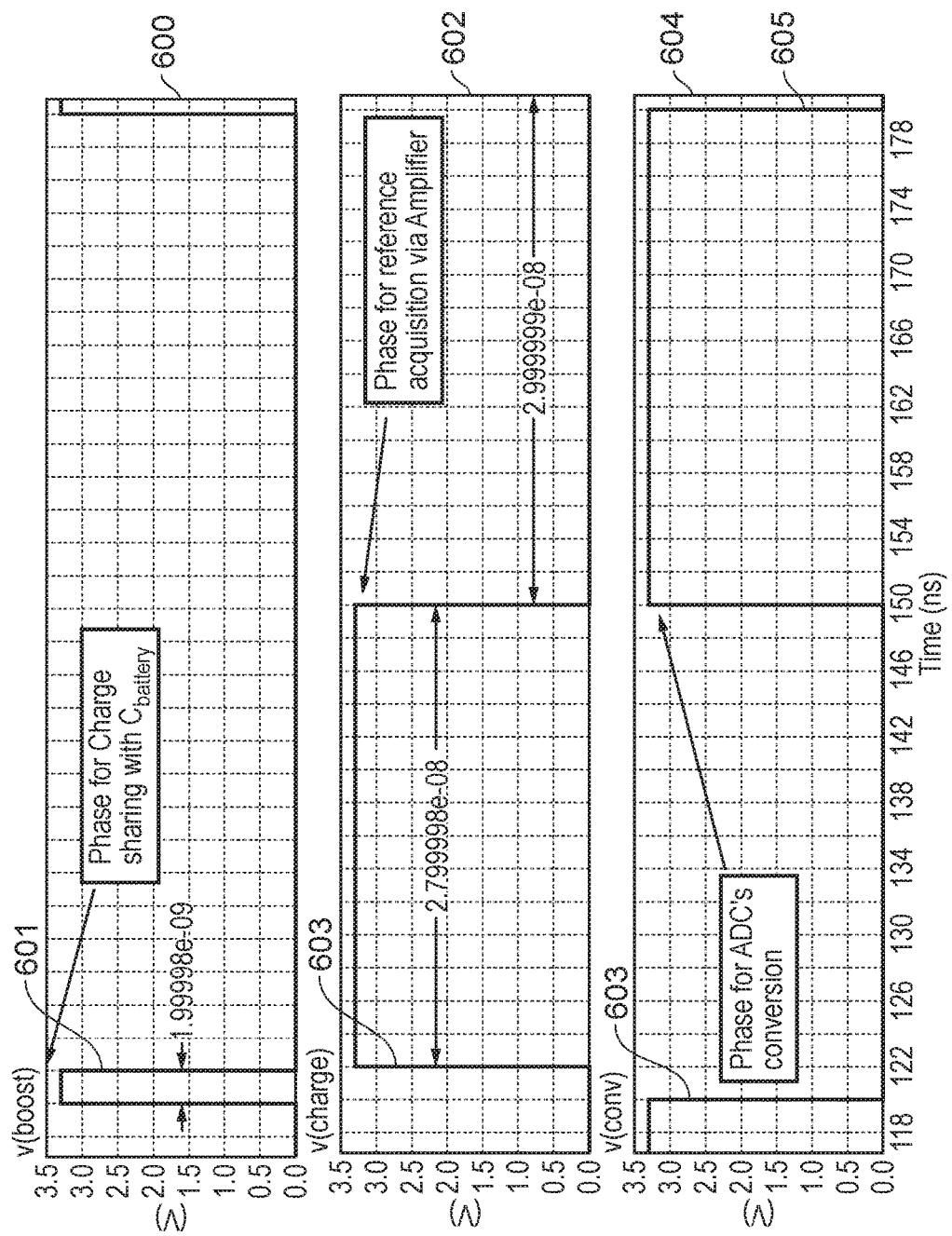
FIG. 13 shows three charts showing the phases of operation of the circuit shown in FIG. 8.

FIG. 13 is a timing chart for the different phases of operation described above in connection with the voltage reference circuit 400. The upper chart 600 shows the first part of the acquisition phase when charge-sharing occurs between $C_{RES}$ and $C_{BAT}$. As can be seen, this boost portion 601 of the operation of the circuit lasts around 2 ns. The middle chart 602 shows the second part 603 of the acquisition phase, when $C_{RES}$ is charged by the reference buffer 401. As can be seen, this portion of the operation lasts for around 28 ns. The lower chart 604 shows the conversion phase 605 of the ADC. As can be seen, this lasts for around 30 ns.

Figure 14:
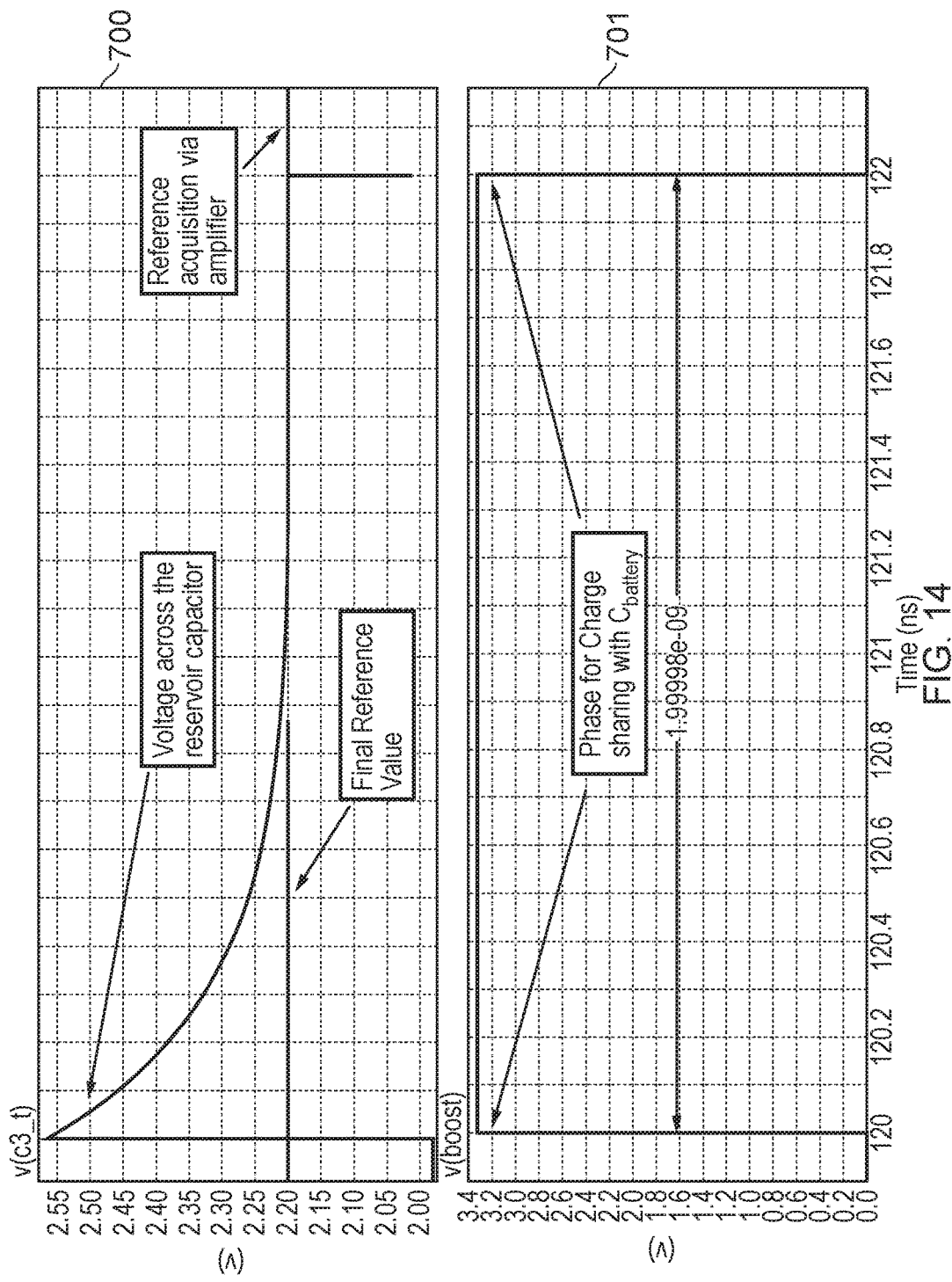
FIG. 14 shows two charts showing the voltage across a reservoir capacitor of the circuit of FIG. 8.

FIG. 14 shows the voltage across the reservoir capacitor $C_{RES}$ during operation of the voltage reference circuit 400. The upper chart 700 shows voltage across the reservoir capacitor during first part of acquisition phase. The lower chart 701 shows the first part of the acquisition phase.

Figure 15:
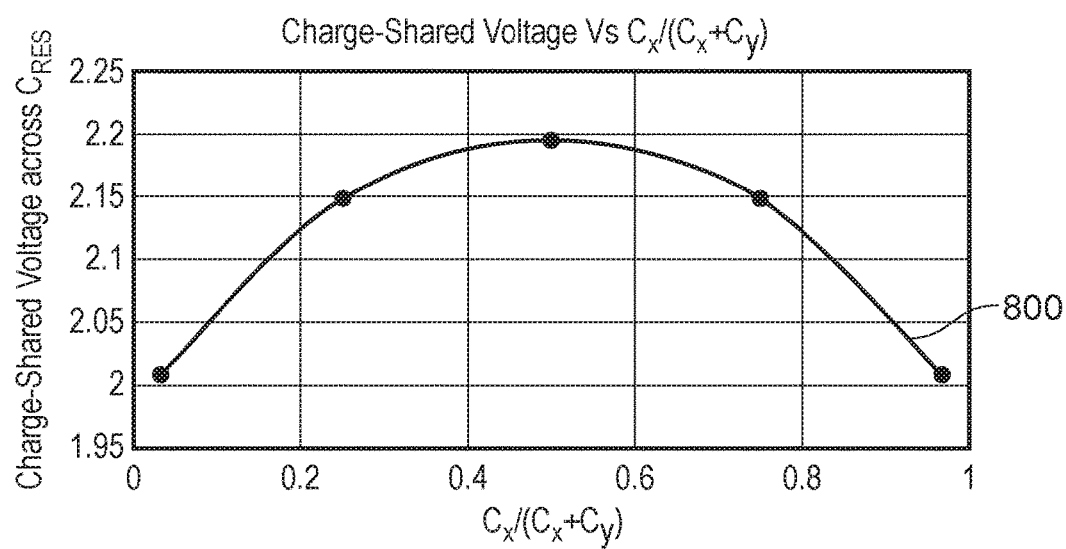
FIG. 15 shows a chart showing the voltage across the reservoir capacitor of FIG. 8 at the end of charge sharing.

FIG. 15 shows the charge-shared voltage 800 across $C_{RES}$ based on various different values of $C_X$ and $C_Y$. In particular, FIG. 15 shows variation in the fraction $C_x/(C_x+C_y)$ from 1/32 to 31/32 in five steps. The profile of the charge drawn by the reservoir capacitor is very similar to the ADC's reference charge consumption with reference to its input voltage. The maximum charge is drawn near the inputs corresponding to mid-codes, and the curve is symmetric about the mid-codes. Therefore, the battery capacitor can be configured such that $C_x/(C_x+C_y)$ is close to 0.5 when the previous ADC input is close to the mid-codes.

Furthermore, it may be configured such that $C_x/(C_x+C_y)$ is close to 0 or 1 when the previous ADC input is close to the end-codes. Using this arrangement, most of the input-dependent reference charge required from the reference buffer may be eliminated (or significantly reduced). This will significantly reduce the design complexity of the reference buffer.

Figure 16:
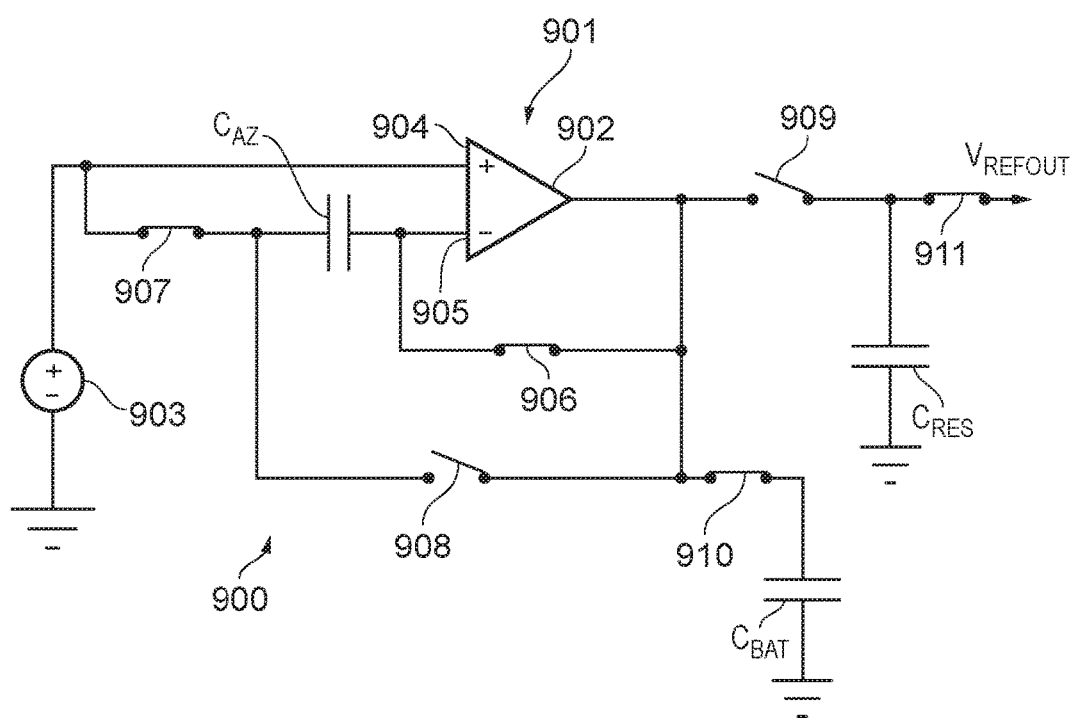
FIG. 16 is a schematic diagram of a circuit in a first configuration, in accordance with a further embodiment of the disclosure.

A further embodiment of the present disclosure will now be described with reference to FIG. 16. FIG. 16 shows a voltage reference circuit 900 in accordance with a further embodiment of the disclosure. The voltage reference circuit 900 includes a reference buffer 901. The reference buffer 901 includes an amplifier 902 which may be an auto-zeroed load-stabilized two-stage amplifier. The inventors of the present disclosure have appreciated that by disconnecting the voltage reference circuit from the ADC, during the acquisition phase, the amplifier of the reference buffer may be auto-zeroed. In this particular case, the use of an auto-zeroed load-stabilized two-stage amplifier improves the circuit's immunity to 1/f noise. A band gap voltage source 903 is connected to the non-inverting input 904 of the amplifier 902. Other types of voltage source may be used. The output of the amplifier 902 provides negative feedback to the inverting input 905 of amplifier 902. Switch 906 is provided in the feedback loop. An auto-zero capacitor $C_{AZ}$ is coupled between the inverting input of the amplifier 905 and the band gap voltage source 903. A switch 907 is provided between $C_{AZ}$ and the band gap voltage source 903. The output of the amplifier 902 is also connected to the switch 907 and the capacitor $C_{AZ}$ via switch 908. A reservoir capacitor $C_{RES}$ is connected to an output of the amplifier 902 via switch 909. $C_{RES}$ is also connected to ground and to the output of the circuit $V_{REFOUT}$ via switch 911. A battery capacitor $C_{BAT}$ is also coupled to the output of amplifier 902 via switch 910.

Figure 17:
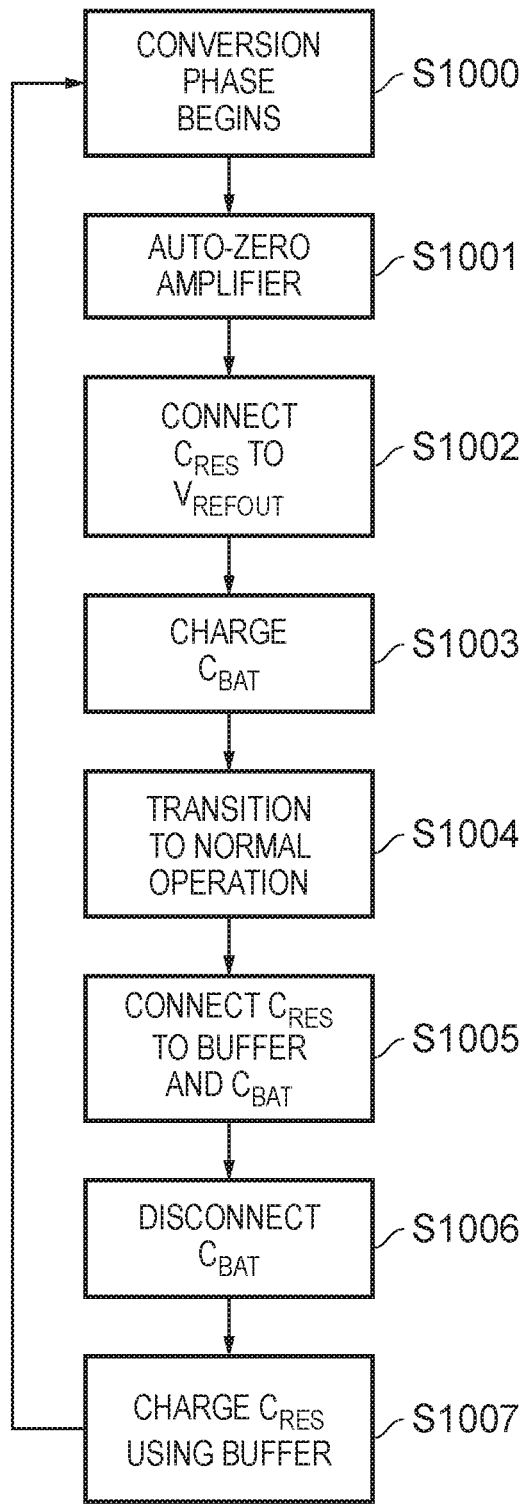
FIG. 17 is a flow chart showing a method of operation of the circuit of FIG. 16.

Operation of the circuit shown in FIG. 16 will now be described with reference to FIG. 17. FIG. 16 shows the configuration of the voltage reference circuit 900 during a first phase of operation. The first phase of operation is while an ADC to which the circuit is connected is in a conversion phase (S1000). In this phase, the amplifier 902 is auto-zeroed by closing switch 907 and 906 in order to store the input-offset voltage and 1/f noise on capacitor $C_{AZ}$ (S1001). Switch 909 is open so that the reservoir capacitor $C_{RES}$ is not connected to the output of the amplifier 902. Instead, the reservoir capacitor is connected to $V_{REFOUT}$ by closing switch 911 (S1002). Switch 908 is open and switch 910 is closed. During this first phase, $C_{BAT}$ acts as a stabilization capacitor which gets charged close to the reference voltage of the band gap voltage reference 903 (S1003).

Figure 18:
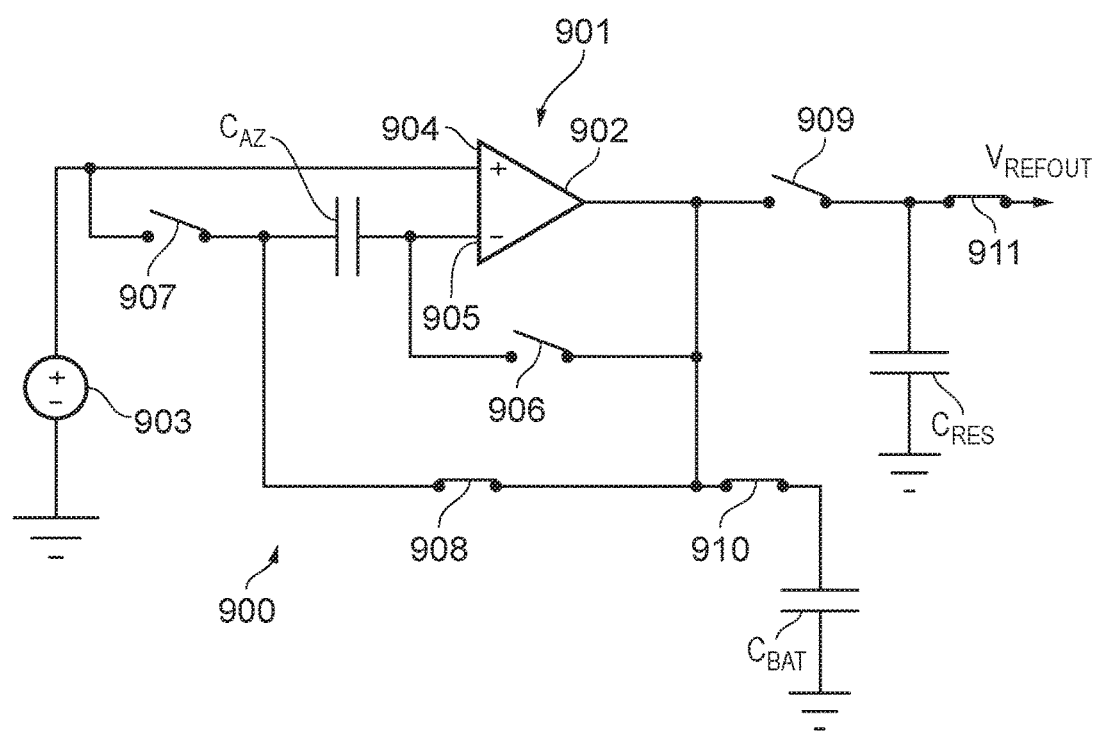
FIG. 18 is a schematic diagram of the circuit of FIG. 16 in a second configuration.

FIG. 18 shows the voltage reference circuit 900 at the end of the first phase of operation. This is at the end of the ADC's conversion phase. In this phase, switches 907 and 906 are opened and switch 908 is closed. Here, the amplifier 902 transitions from its auto-zeroed state to normal (or amplification) operation (S1004). The $C_{AZ}$ capacitor cancels the input offset and 1/f noise and remains connected between the amplifier's output and its inverting input 905. There is no change in state for $C_{BAT}$ and $C_{RES}$ during this step.

Figure 19:
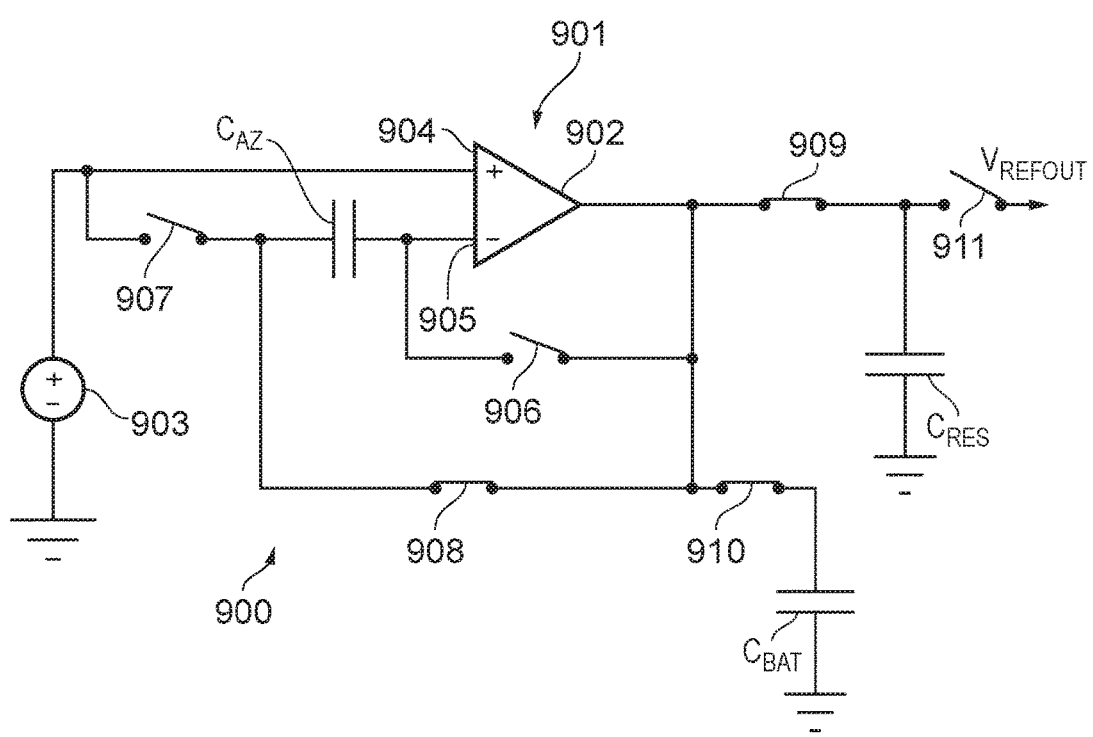
FIG. 19 is a schematic diagram of the circuit of FIG. 16 in a third configuration.

FIG. 19 shows the configuration of the voltage reference circuit 900 during the first part of the acquisition phase. This may be regarded as the second phase of operation. In this configuration, switch 909 is closed at the same time as $C_{RES}$ is disconnected from the ADC by opening switch 911. $C_{RES}$ is connected to the reference buffer 901 and also to $C_{BAT}$ (S1005). Charge-sharing occurs between $C_{RES}$ and $C_{BAT}$. In this example, around half of the charge lost by $C_{RES}$ during the conversion phase is gained almost instantly by $C_{RES}$. In this example, the value of $C_{BAT}$ is the same as the value of $C_{RES}$. The duration of this step is so small that the amplifier does not get time to slew the load seen on its output.

Figure 20:
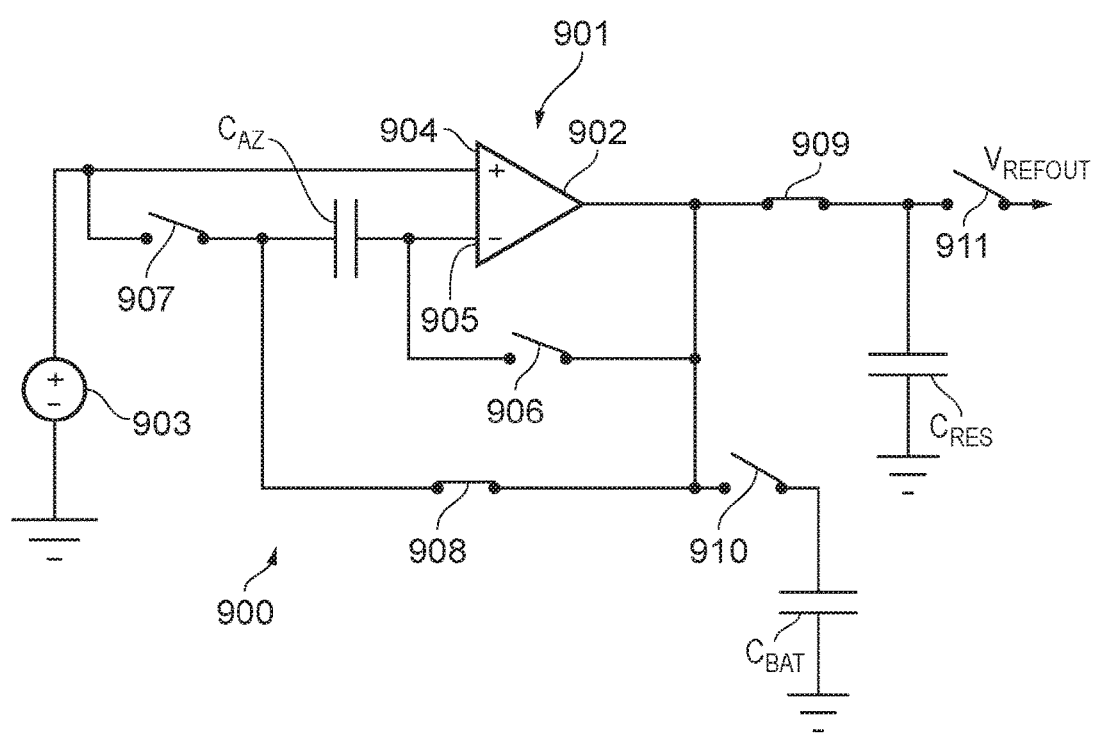
FIG. 20 is a schematic diagram of the circuit of FIG. 16 in a fourth configuration.

FIG. 20 shows the voltage reference circuit 900 in the third phase of operation, which is the second part of the acquisition phase. Here, switch 910 is open to disconnect $C_{BAT}$ from the reference buffer 901 and from $C_{RES}$ (51006). Switch 909 remains closed so that $C_{RES}$ remains connected to the output of the amplifier 902. $C_{RES}$ gets charged during this phase by the reference buffer to the reference voltage of the band gap voltage source (51007). At the end of this phase, the amplifier goes back to the configuration shown in FIG. 16.

Figure 21:
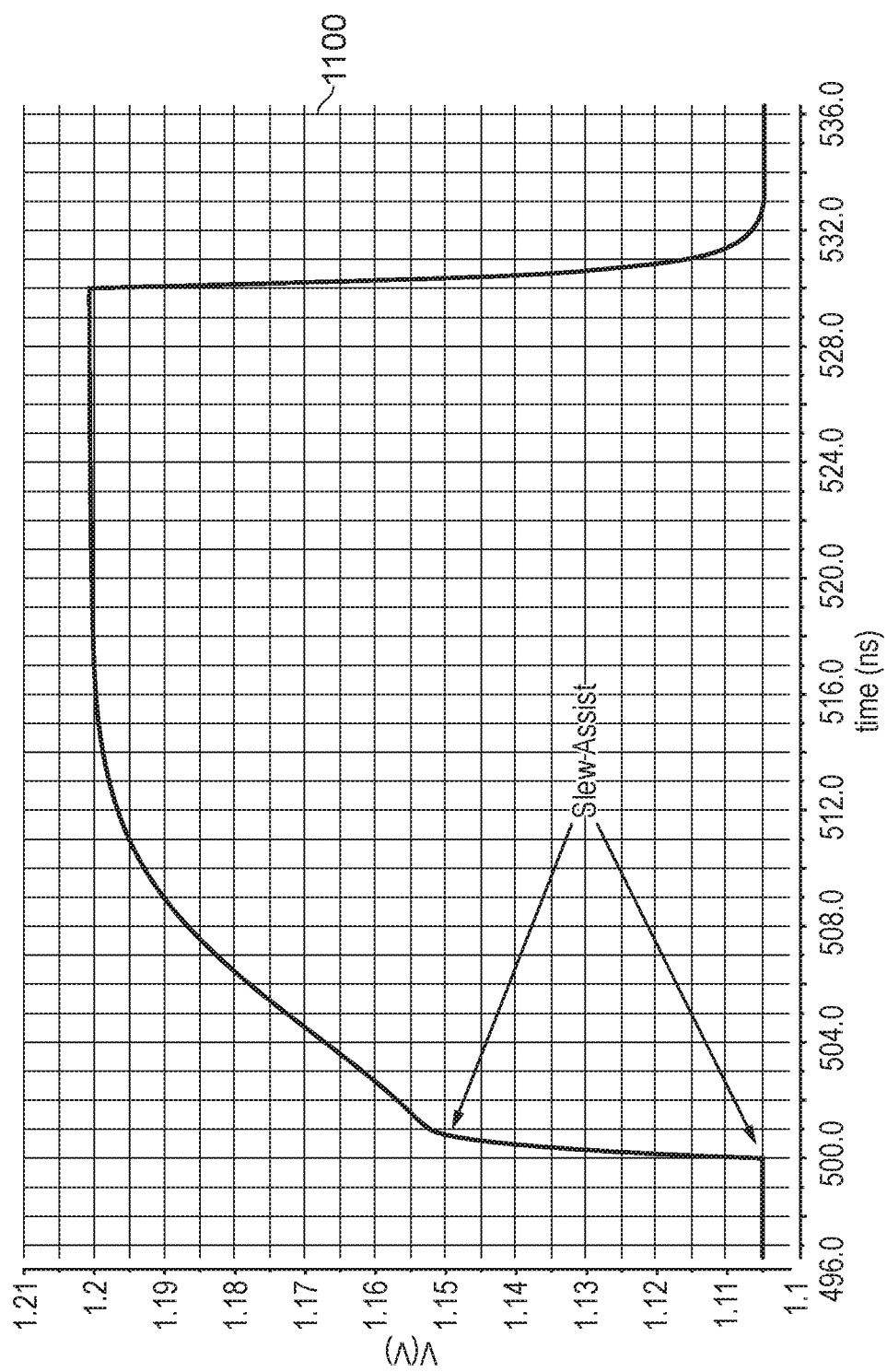
FIG. 21 is a chart showing the transient waveform of voltage across a reservoir capacitor of the circuit shown in FIG. 16 during an ADC's acquisition phase.

FIG. 21 is a chart 1100 showing the transient waveform of voltage across the reservoir capacitor for this embodiment. As can be seen, $C_{BAT}$ provides slew assist in order to provide the reservoir capacitor with around 50% of its charge. During the remaining portion of the acquisition phase, the reference buffer charges $C_{RES}$ up to the reference voltage. As can be seen, the reservoir capacitor $C_{RES}$ recovers around 50% of its charge within ins. The amplifier 902 then replenishes the remaining charge in the rest of the acquisition time.

An advantage of the above-described examples is that, because the reservoir capacitor is provided with a charge boost, the amount of charge required from the reference buffer is reduced.

Furthermore, the input-dependent reference current can be reduced by controlling the charge available from the battery capacitor $C_{BAT}$. This may be controlled as a function of the ADC's output data based on the previous conversion. Additionally, as the demand on the reference buffer 401, 901 is reduced, the corresponding ringing on the supply of the reference buffer is also reduced in the acquisition phase, making the overall system quieter. Furthermore, by charge-sharing between the reservoir capacitor and the battery capacitor, the slew rate and unity gain frequency (UGF) requirements on the amplifier are relaxed, thereby reducing power consumption and making the reference buffer 401, 901 easier to design.

The term "source of current" refers to an element that provides current to the capacitors of the switch-capacitor arrangement. A source of current may provide current at different values, depending on the load.

The invention claimed is:

1. A voltage reference circuit, comprising:
a source of current, and
a switched capacitor arrangement coupled to an output of the source of current, the switched capacitor arrangement comprising a battery capacitor and a reservoir capacitor, the reservoir capacitor configured to provide a reference voltage at an output of the circuit, wherein the switched capacitor arrangement configured to:
output the reference voltage using the reservoir capacitor during a first phase of operation;
redistribute charge between the battery capacitor and the reservoir capacitor during a second phase of operation in order to increase the charge on the reservoir capacitor; and
continue charging the reservoir capacitor using the source of current during a third phase of operation.

2. A circuit according to claim 1, wherein during the second and third phase, no reference voltage is supplied by the circuit.

3. A circuit according to claim 1, wherein the switched capacitor is further configured to: charge the battery capacitor using the source of current during the first phase of operation.

4. A circuit according to claim 1, wherein during the first phase of operation, the switched capacitor arrangement is configured such that the battery capacitor and the reservoir capacitor are not connected and such that the reservoir capacitor is connected to the output of the circuit.

5. A circuit according to claim 1, wherein during the second phase of operation, the switched capacitor arrangement is configured such that the battery capacitor and the reservoir capacitor are connected to permit charge to be redistributed between the capacitors.

6. A circuit according to claim 1, wherein during the third phase of operation the switched capacitor arrangement is configured such that the reservoir capacitor is connected to the source of current to permit the reservoir capacitor to be charged by the source of current.

7. A circuit according to claim 1, wherein the switched capacitor arrangement is further configured to disconnect the battery capacitor from the reference buffer at the end of the first phase of operation.

8. A circuit according to claim 1, wherein the switched capacitor arrangement is further configured to: after the third phase of operation, return to the first phase of operation.

9. A circuit according to claim 1, wherein the battery capacitor comprises a plurality of sub-capacitors and a plurality of switches, arranged to permit the sub-capacitors to be configured in series or in parallel, in order to control the value of the charge provided by the battery capacitor.

10. A circuit according to claim 9, wherein the output value of the battery capacitor is capable of being controlled by an output from the circuit to which the voltage reference is being provided.

11. A circuit according to claim 1, wherein the source of current comprises a reference buffer having an amplifier configured with negative feedback.

12. A circuit according to claim 11, wherein the amplifier is an operational transconductance amplifier.

13. A circuit according to claim 1, wherein the source of current comprises an auto-zeroed amplifier, and the circuit is configured to auto-zero the amplifier during the first phase of operation.

14. A circuit according to claim 13, further comprising an auto-zero capacitor, coupled to an inverting input of the amplifier, the auto-zero capacitor configured to store input-offset voltage and 1/f noise during the first phase of operation.

15. A circuit according to claim 13, wherein the battery capacitor is configured to: stabilize the auto-zeroed amplifier during the first phase of operation.

16. A circuit according to claim 1, wherein:
the circuit is for providing a reference voltage to a converter;
the first phase is a conversion phase of the converter;
the second phase is a first part of the acquisition phase of the converter; and
the third phase is a second part of the acquisition phase of the converter.

17. A circuit according to claim 1, wherein the source of current comprises a bandgap voltage reference.

18. A converter circuit comprising a voltage reference according to claim 1.

19. A method of providing a reference voltage, comprising:
outputting a reference voltage, using a reservoir capacitor of a switched capacitor arrangement, during a first phase of operation during which a battery capacitor of the switched capacitor arrangement is switchably electrically connected to a source of current, then switchably electrically disconnected from the source of current;
redistributing charge between the battery capacitor of the switched capacitor arrangement and the reservoir capacitor during a second phase of operation in order to increase the charge on the reservoir capacitor; and
continuing to charge the reservoir capacitor using the source of current during a third phase of operation.

20. A successive approximation register (SAR) analog-to-digital converter (ADC) circuit, comprising:
a capacitive digital-to-analog converter (DAC); and
a voltage reference circuit for providing a voltage reference to the DAC during a conversion phase of the DAC, the voltage reference circuit comprising:
a source of current;
a reservoir capacitor; and
a battery capacitor;
wherein the voltage reference circuit is configured to:
couple the reservoir capacitor to the DAC during a conversion phase;
decouple the reservoir capacitor from the DAC and redistribute charge between the at least one battery capacitor and the reservoir capacitor during a first part of an acquisition phase of the DAC; and
charge the reservoir capacitor using the source of current during a second part of the acquisition phase.

21. The method of claim 19, further comprising providing the reference voltage to a converter, and wherein:
the first phase is a conversion phase of the converter;
the second phase is a first part of the acquisition phase of the converter; and
the third phase is a second part of the acquisition phase of the converter.

22. The method of claim 21, wherein providing the reference voltage to the converter occurs during the first phase but not during the second phase and not during the third phase.

23. The circuit of claim 20, wherein the source of current comprises a reference buffer having an amplifier configured with negative feedback.

24. The circuit according to claim 20, wherein the source of current comprises an auto-zeroed amplifier, and the circuit is configured to auto-zero the amplifier during the first phase of operation.

25. The circuit according to claim 24, further comprising an auto-zero capacitor, coupled to an inverting input of the amplifier, the auto-zero capacitor configured to store input-offset voltage and 1/f noise during the first phase of operation.

26. A circuit according to claim 25, wherein the battery capacitor is configured to: stabilize the auto-zeroed amplifier during the first phase of operation.

* * * * *